United States Patent
Li et al.

(10) Patent No.: US 11,280,824 B2
(45) Date of Patent: Mar. 22, 2022

(54) HIGH SENSITIVE PHASE SELECTION METHOD

(71) Applicant: Hitachi Energy Switzerland AG, Baden (CH)

(72) Inventors: YouYi Li, Västerås (SE); Kai Liu, Beijing (CN); Jianping Wang, Västerås (SE)

(73) Assignee: Hitachi Energy Switzerland AG, Baden (CH)

( * ) Notice: Subject to any disclaimer, the term of this patent is extended or adjusted under 35 U.S.C. 154(b) by 58 days.

(21) Appl. No.: 16/956,130

(22) PCT Filed: Dec. 20, 2017

(86) PCT No.: PCT/EP2017/083821
§ 371 (c)(1),
(2) Date: Jun. 19, 2020

(87) PCT Pub. No.: WO2019/120517
PCT Pub. Date: Jun. 27, 2019

(65) Prior Publication Data
US 2020/0319241 A1    Oct. 8, 2020

(51) Int. Cl.
*G01R 31/08* (2020.01)
*H02H 1/00* (2006.01)
*H02H 7/26* (2006.01)

(52) U.S. Cl.
CPC ......... *G01R 31/085* (2013.01); *G01R 31/088* (2013.01); *H02H 1/0007* (2013.01); *H02H 7/26* (2013.01)

(58) Field of Classification Search
CPC .... G01R 31/085; G01R 31/088; G01R 31/08; H02H 1/0007; H02H 7/26; H02H 3/305; H02H 3/042
(Continued)

(56) References Cited

U.S. PATENT DOCUMENTS

| 5,783,946 A | 7/1998 | Yang |
| 6,525,543 B1 | 2/2003 | Roberts et al. |

(Continued)

FOREIGN PATENT DOCUMENTS

| CN | 101291056 A | 10/2008 |
| CN | 102324722 A | 1/2012 |

(Continued)

*Primary Examiner* — Giovanni Astacio-Oquendo
(74) *Attorney, Agent, or Firm* — Slater Matsil, LLP (57) ABSTRACT

A method can be used for phase selection using multi-terminal measurements of a transmission line of a power system. The method includes obtaining, using measurements from a plurality of terminals of the transmission line, delta differential current values $\Delta I_{diffA}(t)$, $\Delta I_{diffB}(t)$, $\Delta I_{diffC}(t)$, at time t, between pre-fault differential current measurements and post-fault differential current measurements from all three phases (A, B, C) of the transmission line. The method also includes determining at least one of the phases to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

24 Claims, 6 Drawing Sheets

(58) Field of Classification Search
USPC .................................... 324/539, 537, 500
See application file for complete search history.

(56) References Cited

U.S. PATENT DOCUMENTS

| | | | |
|---|---|---|---|
| 9,118,181 B2 | 8/2015 | Balcerek et al. | |
| 11,022,655 B2* | 6/2021 | Liu | G01R 31/50 |
| 2015/0160297 A1 | 6/2015 | Li et al. | |
| 2017/0356965 A1 | 12/2017 | Guzman-Casillas et al. | |
| 2020/0335967 A1* | 10/2020 | Li | H02H 1/0007 |
| 2021/0342502 A1* | 11/2021 | Feng | G06F 30/20 |

FOREIGN PATENT DOCUMENTS

| | | |
|---|---|---|
| CN | 102608495 A | 7/2012 |
| CN | 104364988 A | 2/2015 |
| EP | 0316202 A2 | 11/1988 |
| JP | 2005221404 A | 8/2005 |
| WO | 2015028062 A1 | 3/2015 |

* cited by examiner

HIGH SENSITIVE PHASE SELECTION METHOD

CROSS-REFERENCE TO RELATED APPLICATIONS

This patent application is a national stage filing of International Application No. PCT/EP2017/083821, filed on Dec. 20, 2017 and published as WO 2019/120517A1, which application is hereby incorporated by reference in its entirety.

TECHNICAL FIELD

Embodiments presented herein relate to mechanisms for phase selection using multi-terminal measurements of a transmission line of a power system.

BACKGROUND

Transmission lines are a vital part of the electrical distribution system, as they provide the path to transfer power between generation and load. Transmission lines are ideally tightly interconnected for reliable operation. Factors like de-regulated market environment, economics, right-of-way clearance and environmental requirements have pushed utilities to operate transmission lines close to their operating limits. Any fault, if not detected and isolated quickly will cascade into a system wide disturbance causing widespread outages for a tightly interconnected system operating close to its limits. Transmission protection systems are designed to identify the location of faults and isolate only the faulted section. The key challenge to the transmission line protection lies in reliably detecting and isolating faults compromising the security of the system.

The high level factors influencing line protection include the criticality of the line (in terms of load transfer and system stability), fault clearing time requirements for system stability, line length, the system feeding the line, the configuration of the line (the number of terminals, the physical construction of the line, the presence of parallel lines), the line loading, the types of communications available, and failure modes of various protection equipment. The more detailed factors for transmission line protection directly address dependability and security for a specific application. The protection system selected should provide redundancy to limit the impact of device failure, and backup protection to ensure dependability. Reclosing may be applied to keep the line in service for temporary faults, such as lightning strikes. The maximum load current level will impact the sensitivity of protection functions, and may require adjustment to protection functions settings during certain operating circumstances. Single-pole tripping applications impact the performance requirements of distance elements, differential elements, and communications schemes. The physical construction of the transmission line is also a factor in protection system application. The type of conductor, the size of conductor, and spacing of conductors determines the impedance of the line, and the physical response to short circuit conditions, as well as line charging current. In addition, the number of line terminals determines load and fault current flow, which must be accounted for by the protection system. Parallel lines also impact relaying, as mutual coupling influences the ground current measured by protective relays. The presence of tapped transformers on a line, or reactive compensation devices such as series capacitor banks or shunt reactors, also influences the choice of protection system, and the actual protection device settings.

The most widely used fault protection systems for transmission lines are line differential protection systems, which use only the electrical current value information from the power line. Current based line differential systems, also known as line differential systems, do not require voltage measuring devices, as they do not use voltage values in their fault determinations. Line differential systems are less sensitive to power swings and sudden load changes in the system and are generally less sensitive to or even immune from certain conditions on the line, including zero sequence mutual coupling effects and/or current reversals, among others. However, along with the advantages are several significant disadvantages, including reliance on high communication channel performance, which is required between the local and remote protective relays on the line. In addition, conventional line differential systems using phase current quantities are limited in their ground fault resistance coverage and also are a compromise to an extent in security under current transformer (CT) saturation conditions.

It is known that zero sequence current based differential protection of transmission lines can provide perfect sensitivity for high impedance faults. But, the zero sequence current based differential protection is not phase-separated inherently. It needs additional phase selection for single-pole tripping, otherwise it have to trip all three phases. Obviously, the sensitivity of the phase selection function will influence the total sensitivity of the zero sequence current based line differential protection.

Most existing methods for phase selection are based on local currents or local voltages. These phase selection methods have a common problem in that their sensitivity is influenced greatly by the system conditions and operation statuses. For example, methods based on local currents may have bad sensitivity at weak end side, because the faulted currents may be very small. Further, methods based on local voltages may have bad sensitivity at the strong end side, because there may be no change on the voltages after the fault occurs. Yet further, high impedance faults will make the sensitivity of the phase selection even worse. Such low-sensitive phase selection methods based on local measurements are not suitable for zero sequence current line differential protection, which mainly focus on the high impedance faults.

Thereby, some other phase selection methods based on multi-terminal measurements instead considering only local measurements are proposed to resolve the existing sensitivity problem as mentioned above In view of the above, phase selection methods based on multi-terminal measurements have better sensitivity than phase selection methods based only on local measurements. But existing phase selection methods may have very low sensitivity under the conditions of large charging current or heavy load. And some of them have very complex logic, which is difficult for implementation.

Hence, there is a need for more efficient mechanisms for phase selection in order to achieve zero sequence current based line differential protection.

SUMMARY

An object of embodiments herein is to provide efficient mechanisms for phase selection during fault determination for a transmission line.

The present invention overcomes the above mentioned problems by providing a high sensitive phase selection method based on multi-terminal measurements, which has good sensitivity even with high impedance faults, different signal to interference ratio conditions, large charging current (long line) and heavy load conditions.

According to a first aspect there is presented a method for phase selection using multi-terminal measurements of a transmission line of a power system.

The method comprises obtaining, using measurements from at least two terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from all phases A, B, C of the transmission line. The method comprises determining the phase A, B, or C to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

According to a second aspect there is presented a phase selection unit for phase selection using multi-terminal measurements of a transmission line of a power system. The phase selection unit comprises processing circuitry. The processing circuitry is configured to cause the phase selection unit to obtain, using measurements from at least two terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from all phases A, B, C of the transmission line. The processing circuitry is configured to cause the phase selection unit to determine the phase A, B, or C to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

According to a third aspect there is presented a phase selection unit for phase selection using multi-terminal measurements of a transmission line of a power system. The phase selection unit comprises an obtain module configured to obtain, using measurements from at least two terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from all phases A, B, C of the transmission line. The phase selection unit comprises a determine module configured to determine the phase A, B, or C to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

According to a fourth aspect there is presented a computer program for phase selection using multi-terminal measurements of a transmission line of a power system, the computer program comprising computer program code which, when run on a phase selection unit according to the second or third aspect, causes the phase selection unit to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Advantageously this provides efficient phase selection during fault determination of the transmission line Advantageously the proposed phase selection has very high sensitivity even for the challenging cases like high impedance faults with large charging currents under different source impedance ratio (SIR) conditions.

Advantageously the proposed phase selection can be used by zero sequence current based differential protection, negative sequence current based differential protection, or the over current protection and distance protection in a line differential protection device.

Advantageously the proposed phase selection enables for easy of implementation on existing differential protection devices.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

The embodiments disclosed herein relate to mechanisms for phase selection using multi-terminal measurements of a transmission line 110 of a power system 100. In order to obtain such mechanisms there is provided a phase selection unit 200, a method performed by the phase selection unit 200, a computer program product comprising code, for example in the form of a computer program, that when run on a phase selection unit 200, causes the phase selection unit 200 to perform the method.

Figure 1:
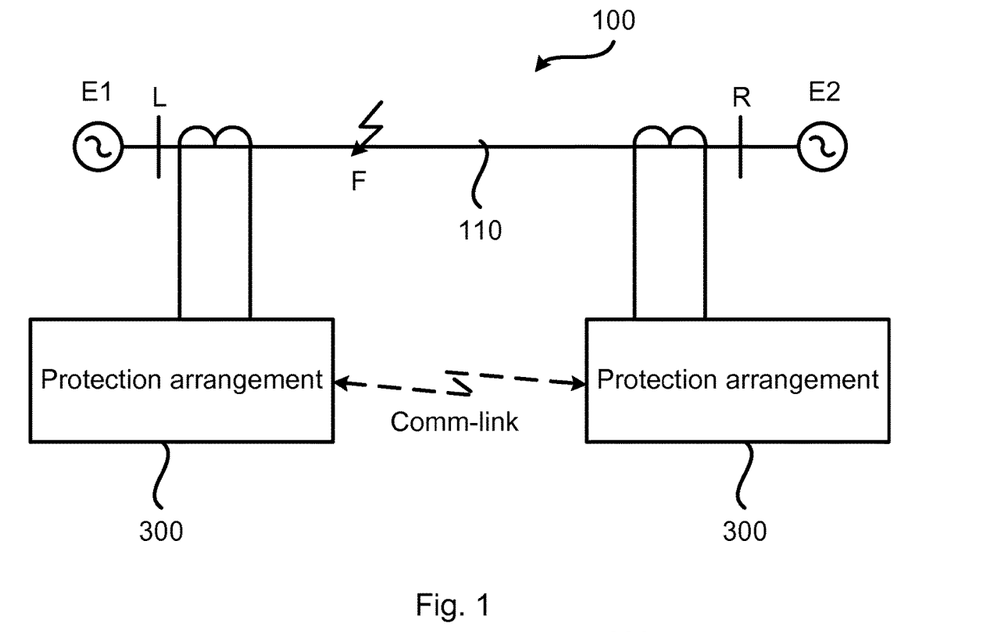
FIG. 1 is a schematic diagram of zero sequence current differential line protection.

A schematic diagram of a zero sequence current differential line protection in a power system 100 is shown in FIG. 1. Current measurements are obtained from the terminals E1 and E2 of a transmission line 110. The transmission line 110 is assumed to have three current phases, hereinafter denoted A, B, C.

Terminal E1 is assumed to be on a local (L) side whereas terminal E2 is assumed to be on a remote (R) side. A fault (F) is assumed to occur along the transmission line 110. The fault is detected from the current measurement. A protection arrangement 300 for zero sequence differential protection of the transmission line 110 is provided at each of the remote side and the local side.

As will be further disclosed below, the current measurement are used to obtain delta differential current values $\Delta I_{diffA}(t)$, $\Delta I_{diffB}(t)$, $\Delta I_{diffC}(t)$ from all phases A, B, C of the transmission line 110 in order to determine which, if any, of the phases A, B, C that is/are faulty. One phase selection unit 200 is placed at each terminal E1, E2. The phase selection units 200 are assumed to be configured for communications with each other over a communications link 120.

Figure 7:
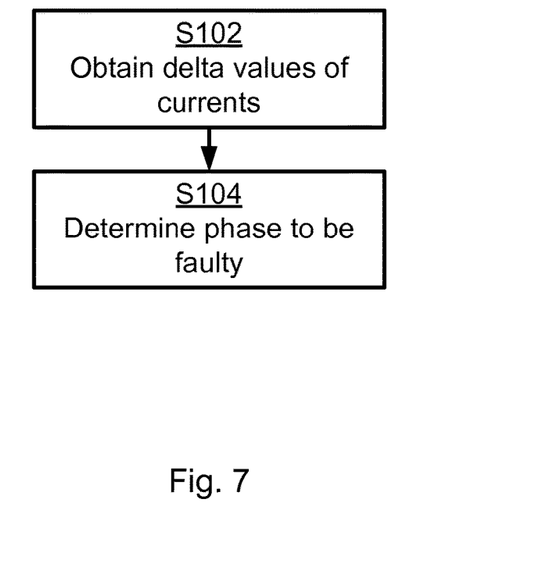
FIG. 7 is a flowchart of a method according to an embodiment.

FIG. 7 is a flowchart illustrating embodiments of methods for phase selection using multi-terminal measurements of a transmission line 110 of a power system 100. The methods are performed by the phase selection unit 200. The methods are advantageously provided as computer programs 1020.

In some aspects, the phase selection is applied for zero sequence current based line differential protection and negative sequence current line differential protection.

In some aspects, the phase selection is applied for distance relay or over current relay in line differential protection device.

At least some of the herein disclosed embodiments are based on the assumption that the differential current of a faulted phase is larger than that of a healthy phase. Any faulted phase(s) can thus be detected by comparing the differential current values of three phase-separated differential currents. Hence the phase selection unit 200 is configured to perform steps S102 and S104:

S102: The phase selection unit 200 obtains, using measurements from two terminals of the transmission line 110, delta differential current values $\Delta I_{diffA}(t)$, $\Delta I_{diffB}(t)$, $\Delta I_{diffC}(t)$ at time t between pre-fault differential current measurements and post-fault differential current measurements from all phases A, B, C of the transmission line 110.

S104: The phase selection unit 200 determines the phase A, B, or C to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

Denote by $\Delta I_{diff\phi}(t)$ a delta differential current value at time t between pre-fault differential current measurements and post-fault differential current measurements of phase $\phi$ where $\phi$ thus may be A, B or C. If the differential currents meet the requirements in the above criterion, the phase $\phi$ is the faulted phase. In other words, the phase A, B, or C is determined to be faulty when the absolute value of the corresponding $\Delta I_{diff\phi}(t)$ is larger than k times the minimum of all the absolute values $|\Delta I_{diffA}(t)|$, $|\Delta I_{diffB}(t)|$, $|\Delta I_{diffC}(t)|$.

Embodiments relating to further details of phase selection using multi-terminal measurements of a transmission line 110 of a power system 100 as performed by the phase selection unit 200 will now be disclosed.

In some aspects, k is regarded as a reliability factor, which ensures the differential value of faulted phase differential current is more than k times larger than the minimum of the differential values of the three phase differential currents. As noted above, the value of k should be larger than 1. According to an embodiment, $1<k\leq3$. According to another embodiment, k 3.

There may be different ways to determine $\Delta I_{diff\phi}(t)$ for $\phi=A$, B or C. According to an embodiment, $\Delta I_{diffA}(t)=I_{diffA}(t)-I_{diffA}(t-T)$, and $\Delta I_{diffB}(t)=I_{diffB}(t)-I_{diffB}(t-T)$, and $\Delta I_{diffC}(t)=I_{diffC}(t)-I_{diffC}(t-T)$, where T is a time delay factor, and $I_{diffA}(t)$, $I_{diffB}(t)$, $I_{diffC}(t)$ are the post-fault differential current measurements and $I_{diffA}(t-T)$, $I_{diffB}(t-T)$, $I_{diffC}(t-T)$ are the pre-fault differential current measurements.

There may be different ways to determine the time delay factor T. In some aspects the time delay factor T is dependent on the fundamental current period used in the power system 100. Particularly, according to an embodiment, T is identical to a fundamental current period of the transmission line 110. There could be fundamental current periods. In some power systems 100, the fundamental frequency is 50 Hz and in others it is 60 Hz. Therefore, according to an embodiment, T=(1/50) s=20 ms (for a 50 Hz power system), or T=(1/60) s=16.67 ms (for a 60 Hz power system).

In some aspects the phase $\phi$ is determined to be faulty only when the absolute value of the corresponding $\Delta I_{diff\phi}(t)$ also is larger than a current threshold $I_{set}$. That is, according to an embodiment, the phase is determined to be faulty only when said absolute value of the corresponding delta differential current value also is larger than a current threshold $I_{set}$.

The current threshold $I_{set}$ might be regarded a setting that ensures that the differential value of the differential current is big enough to keep the calculation stability (if both $\Delta I_{diff\phi}(t)$ and $\min(|\Delta I_{diffA}(t)|, |\Delta I_{diffB}(t)|, |\Delta I_{diffC}(t)|)$ are very small, their comparison make no sense considering of measurement errors). This setting of $I_{set}$ may be 0.05-0.1 times In, where In is the nominal current of a given transmission line 110 based on the maximum transmission load. That is, according to an embodiment, $I_{set}$ is a factor x times In, where $0.05 \leq x \leq 0.1$, and where In is a nominal current value of the transmission line 110.

The criterion for phase $\phi$ to be detected as the faulty phase might then be defined as follows: Phase $\phi$ is faulty if and only if $|\Delta I_{diff\phi}(t)|>k\cdot\min(|\Delta I_{diffA}(t)|, |\Delta I_{diffB}(t)|, |\Delta I_{diffC}(t)|)$ and $|\Delta I_{diff\phi}(t)|>I_{set}$.

The determination of differential current values removes the charging current and load current automatically. In other words, the herein disclosed phase selection will not be influenced by the charging current or load condition.

Further, the criterion, as defined by the above equations for phase $\phi$ to be detected as the faulty phase, mainly depends on the ratio of the differential currents (faulted phase versus healthy phase) instead of amplitudes, which means it has good sensitivity even for high impedance faults. During the internal faults, the differential value of the differential current for healthy phase is zero in theory, no matter if the fault impedance is small or large. Thereby, the ratio of delta differential current values of currents between a faulted phase and a healthy phase is always infinity in theory, thereby: $|\Delta I_{diff\phi}(t)|>>k\cdot\min(|\Delta I_{diffA}(t)|, |\Delta I_{diffB}(t)|, |\Delta I_{diffC}(t)|)$.

Figure 2:
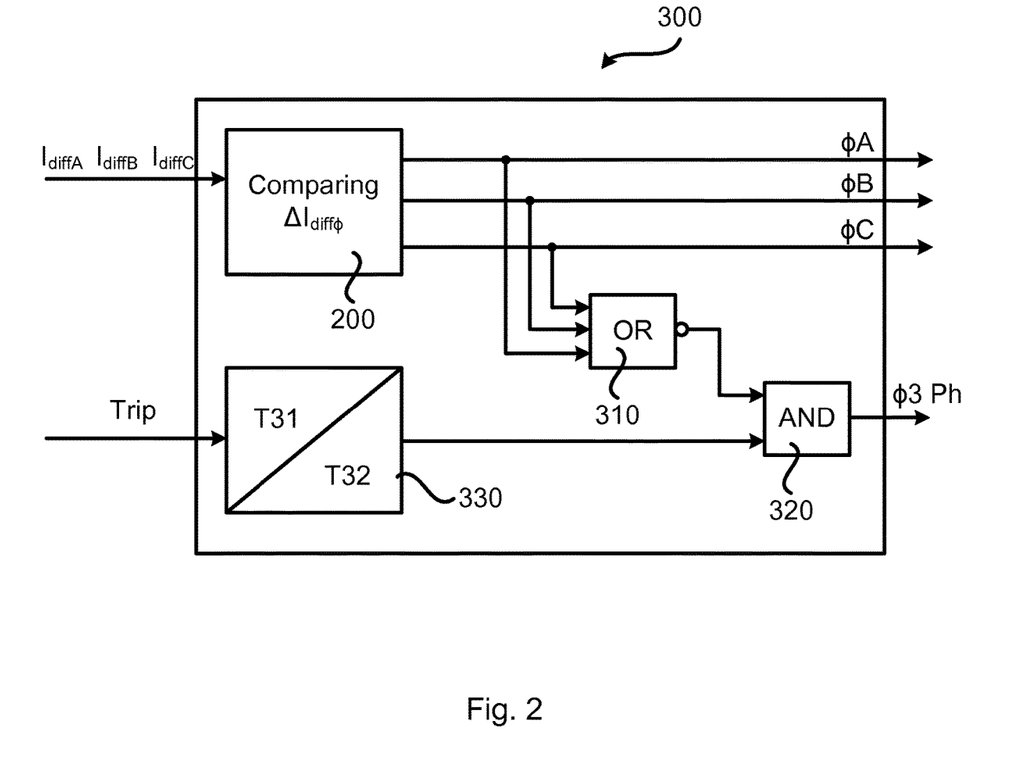
FIG. 2 schematically illustrates an embodiment of an arrangement comprising a phase selection unit according to an embodiment.

FIG. 2 schematically illustrates an embodiment of the protection arrangement 300. The protection arrangement 300 comprises a phase selection unit 200 as herein disclosed. The phase selection unit 200 takes the current values $I_{diff\phi}$ as input for $\phi=A$, B and C, and at times t and t-T. The comparison unit then determines $\Delta I_{diff\phi}(t)$ for $\phi=A$, B or C. The phase selection unit 200 then, after having performed steps S102 and S104 provides as output a logic indication of which phase is faulty. That is, if phase A is faulty then $\phi A=1$, else $\phi A=0$, etc.

The logic indications φA, φB, φC for all phases are provided as input to a logic NOR gate 310. Hence, the logic NOR gate 310 will provide as output a logic 1 only when all inputs are 0, that is only when A=φB=φC=0. Else the output of the logic NOR gate will be 0.

The output of the logic NOR gate 310 is together with a logic trip signal (possibly after being subjected to a time delay circuit 330) provided as input to a logic AND gate 320. Hence, if none of the phases A, B, C are deemed faulty by the phase selection unit 200 and the logic trip signal is set to 1, all phases will be indicated as faulty by the protection arrangement 300.

Figure 3:
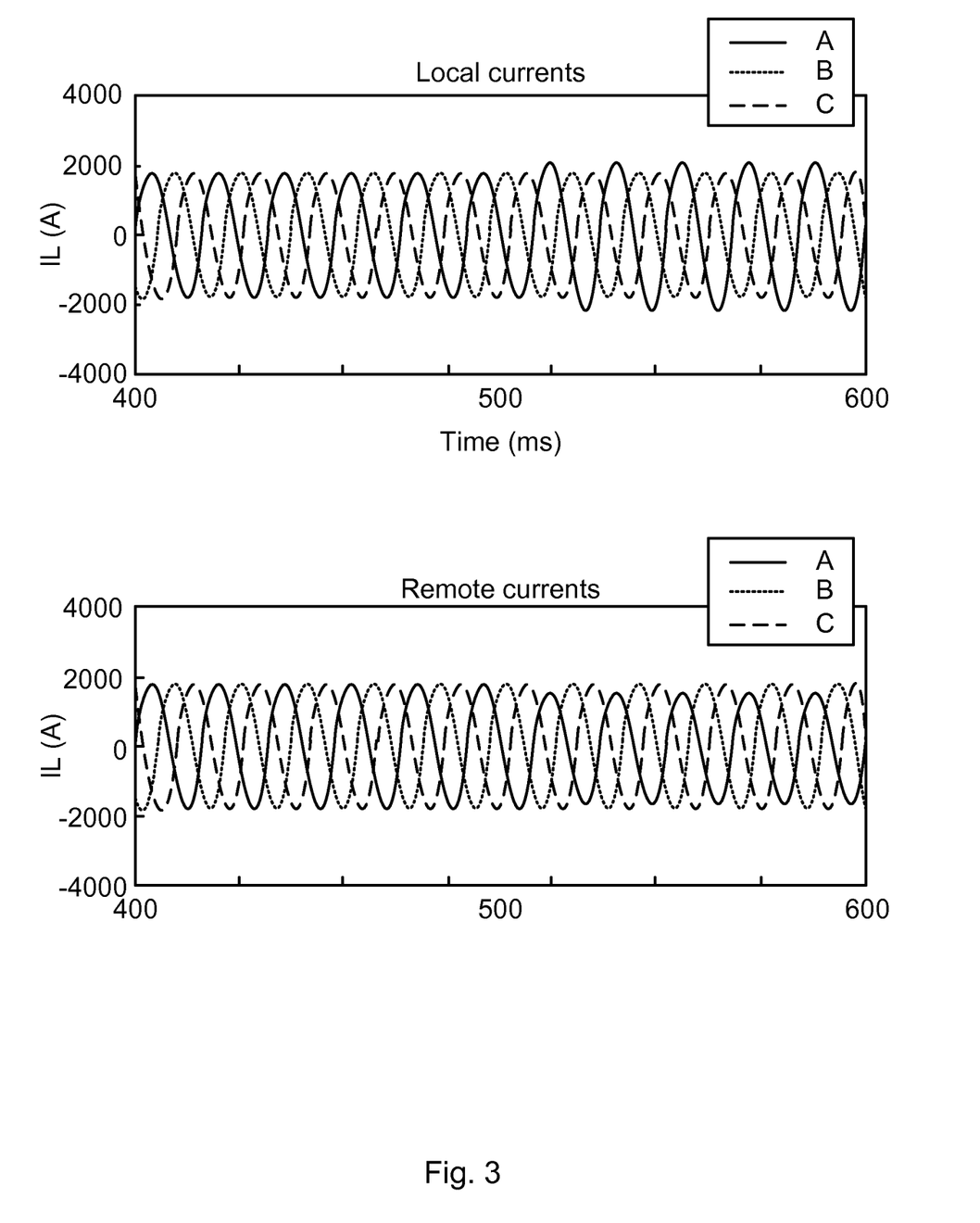
FIGS. 3-6 show simulation results.
Figure 4:
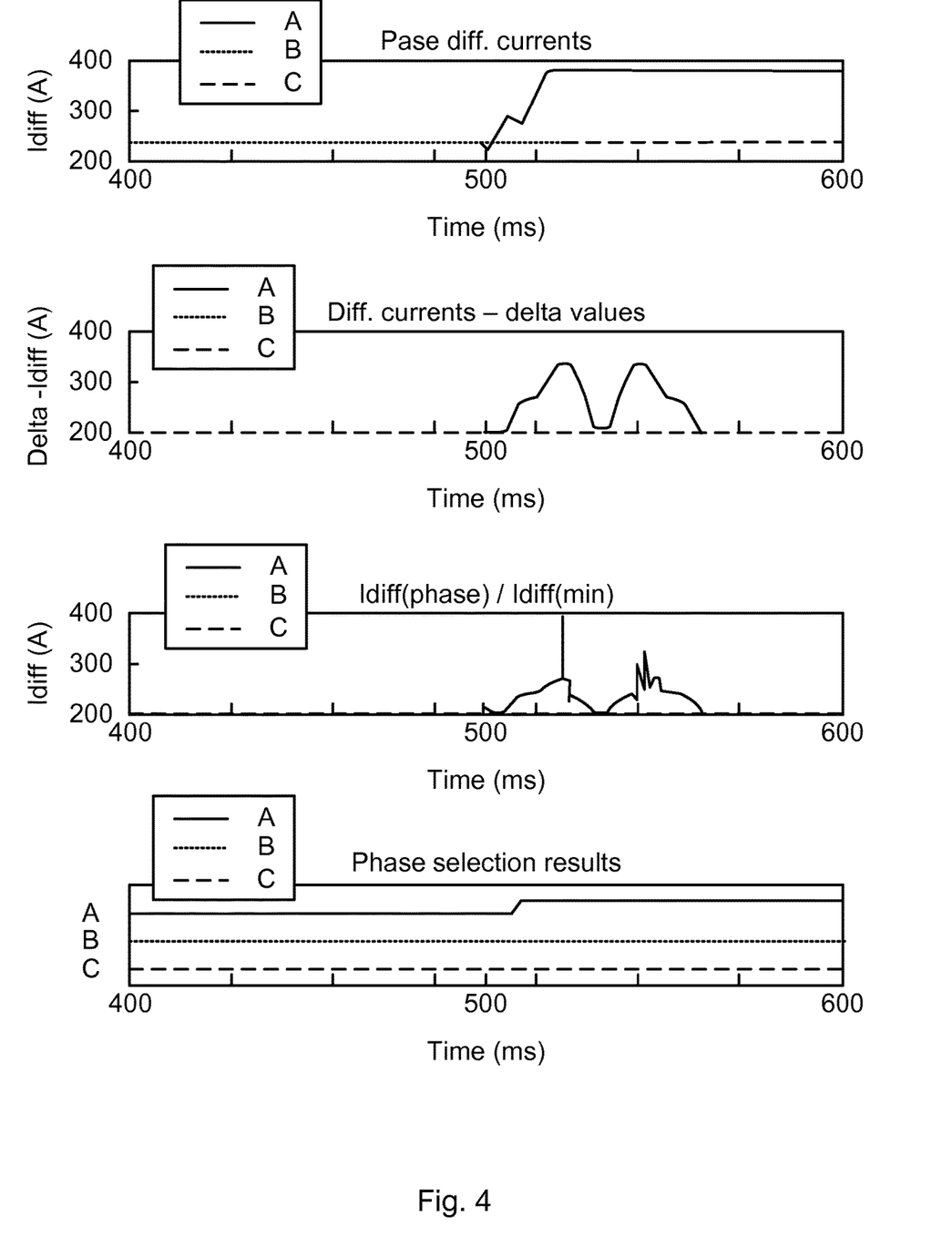
Figure 5:
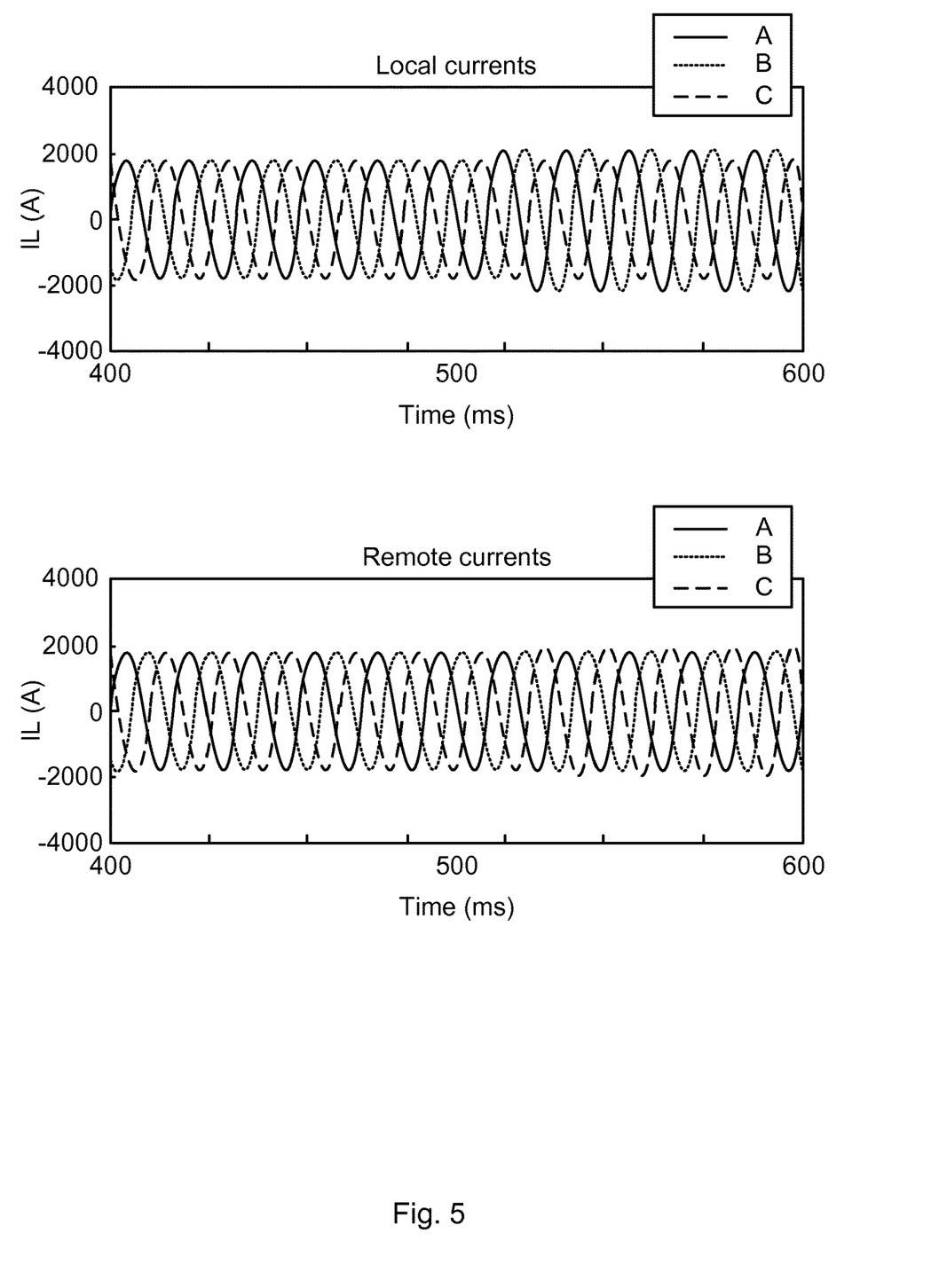
Figure 6:
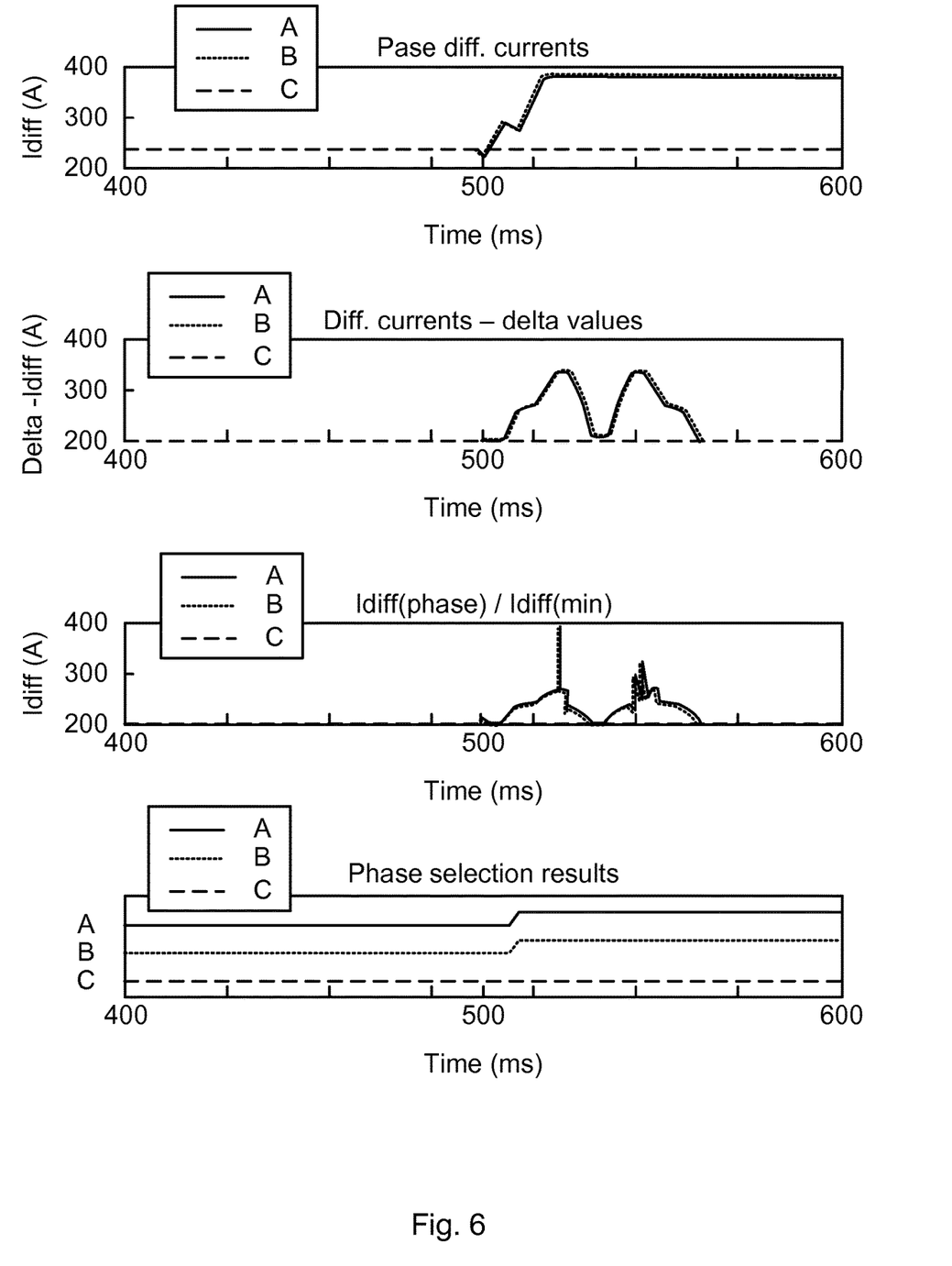

FIGS. 3-4 show an internal A-G fault (phase A to ground fault). FIGS. 5-6 show an internal AB-G fault (phases A and B to ground fault). The fault impedances in both cases are 1000 n. The fault occurs at time 500 ms in both cases.

The change of both local currents (IL) and remote currents (IR) are very small in FIG. 3, because this is a high-impedance fault. Although the charging currents of healthy phases (phases B and C) in FIG. 4 are 200 A, their differential values are very small, while the differential value of the faulty phase A goes up to 280 A. As a result, the ratio of the differential values of differential currents between the faulted phase and healthy phases becomes very large (up to 400) during the fault. This ratio is much larger than the setting of k=3. The proposed method for fault selection can thus detect the faulted phase A reliably with good sensitivity.

As shown in FIGS. 5 and 6, the differential values of the phase-separated differential currents between faulted phases (phases A and B) and healthy phase (phase C) become much larger than the setting (200 versus 3). The proposed method for fault selection can detect the faulted phases A and B reliably with high sensitivity.

Figure 8:
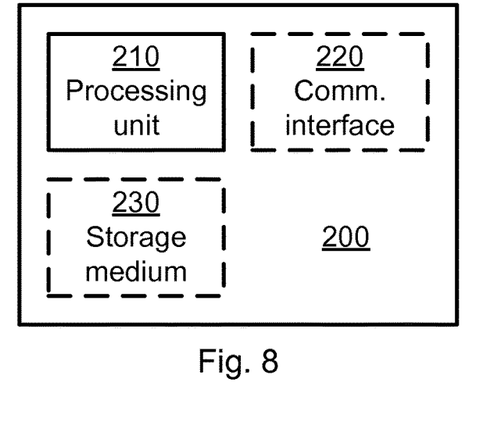
FIG. 8 shows functional units of a phase selection unit according to an embodiment.

FIG. 8 schematically illustrates, in terms of a number of functional units, the components of a phase selection unit 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 1010 (as in FIG. 10), e.g. in the form of a storage medium 230. The processing circuitry 210 may further be provided as at least one application specific integrated circuit (ASIC), or field programmable gate array (FPGA).

Particularly, the processing circuitry 210 is configured to cause the phase selection unit 200 to perform a set of operations, or steps, S102-S104, as disclosed above. For example, the storage medium 230 may store the set of operations, and the processing circuitry 210 may be configured to retrieve the set of operations from the storage medium 230 to cause the phase selection unit 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The phase selection unit 200 may further comprise a communications interface 220 at least configured for communications with another phase selection unit 200; for receiving input and for providing output. As such the communications interface 220 may comprise one or more transmitters and receivers, comprising analogue and digital components. The processing circuitry 210 controls the general operation of the phase selection unit 200 e.g. by sending data and control signals to the communications interface 220 and the storage medium 230, by receiving data and reports from the communications interface 220, and by retrieving data and instructions from the storage medium 230. Other components, as well as the related functionality, of the phase selection unit 200 are omitted in order not to obscure the concepts presented herein.

Figure 9:
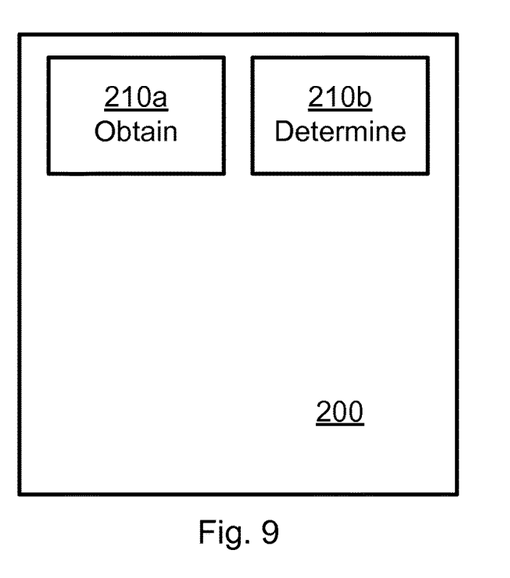
FIG. 9 shows functional modules of a phase selection unit according to an embodiment.

FIG. 9 schematically illustrates, in terms of a number of functional modules, the components of a phase selection unit 200 according to an embodiment. The phase selection unit 200 of FIG. 9 comprises an obtain module 210a configured to perform step S102 and a determine module 210b configured to perform step S104. In general terms, each functional module 210a-210b may in one embodiment be implemented only in hardware and in another embodiment with the help of software, i.e., the latter embodiment having computer program instructions stored on the storage medium 230 which when run on the processing circuitry makes the phase selection unit 200 perform the corresponding steps mentioned above in conjunction with FIG. 9. It should also be mentioned that even though the modules correspond to parts of a computer program, they do not need to be separate modules therein, but the way in which they are implemented in software is dependent on the programming language used. Preferably, one or more or all functional modules 210a-210b may be implemented by the processing circuitry 210, possibly in cooperation with the communications interface 220 and/or the storage medium 230. The processing circuitry 210 may thus be configured to from the storage medium 230 fetch instructions as provided by a functional module 210a-210b and to execute these instructions, thereby performing any steps as disclosed herein.

The phase selection unit 200 may be provided as a standalone device or as a part of at least one further device. Thus, a first portion of the instructions performed by the phase selection unit 200 may be executed in a first device, and a second portion of the of the instructions performed by the phase selection unit 200 may be executed in a second device; the herein disclosed embodiments are not limited to any particular number of devices on which the instructions performed by the phase selection unit 200 may be executed. Hence, the methods according to the herein disclosed embodiments are suitable to be performed by a phase selection unit 200 residing in a cloud computational environment. Therefore, although a single processing circuitry 210 is illustrated in FIG. 8 the processing circuitry 210 may be distributed among a plurality of devices, or nodes. The same applies to the functional modules 210a-210b of FIG. 9 and the computer program 1020 of FIG. 10 (see below).

In some aspects the phase selection unit 200 is part of an Intelligent Electronic Device (IED) such as a protective relay. Thus, according to an embodiment there is provided an IED comprising a phase selection unit 200 as herein disclosed. In some aspects the arrangement 300 is part of the IED.

Figure 10:
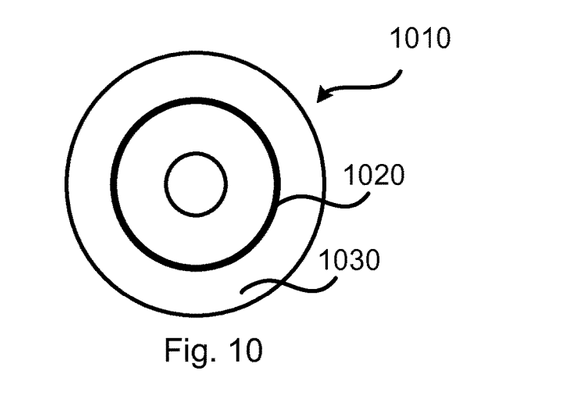
FIG. 10 shows a computer program product.

FIG. 10 shows one example of a computer program product 1010 comprising computer readable storage medium 1030. On this computer readable storage medium 1030, a computer program 1020 can be stored, which computer program 1020 can cause the processing circuitry 210 and thereto operatively coupled entities and devices, such as the communications interface 220 and the storage medium 230, to execute methods according to embodiments described herein. The computer program 1020 and/or computer program product 1010 may thus provide means for performing any steps as herein disclosed.

In the example of FIG. 10, the computer program product 1010 is illustrated as an optical disc, such as a CD (compact disc) or a DVD (digital versatile disc) or a Blu-Ray disc. The computer program product 1010 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1020 is here schematically shown as a track on the depicted optical disk, the computer program 1020 can be stored in any way which is suitable for the computer program product 1010.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for phase selection using multi-terminal measurements of a transmission line of a power system, the method comprising:
   obtaining, using measurements from a plurality of terminals of the transmission line, delta differential current values $\Delta I_{diffA}(t)$, $\Delta I_{diffB}(t)$, $\Delta I_{diffC}(t)$, at time t, between pre-fault differential current measurements and post-fault differential current measurements from all three phases (A, B, C) of the transmission line; and
   determining at least one of the phases to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

2. The method according to claim 1, wherein $\Delta I_{diffA}(t) = I_{diffA}(t) - I_{diffA}(t-T)$, and $\Delta I_{diffB}(t) = I_{diffB}(t) - I_{diffB}(t-T)$, and $\Delta I_{diffC}(t) = I_{diffC}(t) - I_{diffC}(t-T)$, where T is a time delay factor, and where $I_{diffA}(t)$, $I_{diffB}(t)$, $I_{diffC}(t)$ are the post-fault differential current measurements and $I_{diffA}(t-T)$, $I_{diffB}(t-T)$, $I_{diffC}(t-T)$ are the pre-fault differential current measurements.

3. The method according to claim 2, wherein T is identical to a period of fundamental frequency of the transmission line.

4. The method according to claim 3, wherein the power system operates at a fundamental frequency of 60 Hz and T=16.67 ms.

5. The method according to claim 3, wherein the power system operates at a fundamental frequency of 50 Hz and T=20 ms.

6. The method according to claim 1, wherein k≥3.

7. The method according to claim 1, wherein 1<k≤3.

8. The method according to claim 1, wherein the phase is determined to be faulty only when the absolute value of the corresponding delta differential current value also is larger than a current threshold.

9. The method according to claim 8, wherein the current threshold is a factor x times a nominal current value of the transmission line, where 0.05≤x≤0.1.

10. The method according to claim 1, wherein the phase selection is applied for zero sequence current line differential protection and negative sequence current line differential protection.

11. The method according to claim 1, wherein the phase selection is applied for distance relay or over current relay in a line differential protection device.

12. The method according to claim 1, wherein the phase selection is performed by a phase selection unit.

13. An apparatus for use in phase selection of a transmission line of a power system, the apparatus comprising processing circuitry, the processing circuitry being configured to cause the apparatus to:
   obtain, using measurements from at least two terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from three phases A, B, C of the transmission line; and
   determine at least one of the three phases to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

14. The apparatus according to claim 13, wherein $\Delta I_{diffA}(t) = I_{diffA}(t) - I_{diffA}(t-T)$, and $\Delta I_{diffB}(t) = I_{diffB}(t) - I_{diffB}(t-T)$, and $\Delta I_{diffC}(t) = I_{diffC}(t) - I_{diffC}(t-T)$, where T is a time delay factor, and where $I_{diffA}(t)$, $I_{diffB}(t)$, $I_{diffC}(t)$ are the post-fault differential current measurements and $I_{diffA}(t-T)$, $I_{diffB}(t-T)$ are the pre-fault differential current measurements.

15. The apparatus according to claim 14, wherein the power system operates at a fundamental frequency of 50 Hz and T=20 ms.

16. The apparatus according to claim 14, wherein the power system operates at a fundamental frequency of 60 Hz and T=16.67 ms.

17. The apparatus according to claim 13, wherein k≥3.

18. The apparatus according to claim 13, wherein 1<k≤3.

19. An intelligent electronic device, comprising the apparatus according to claim 13.

20. The intelligent electronic device according to claim 19, wherein the intelligent electronic device is a protective relay.

21. A phase selection unit for phase selection using multi-terminal measurements of a transmission line of a power system, the phase selection unit comprising:
   means for obtaining, using measurements from at least two terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from three phases A, B, C of the transmission line; and
   means for determining at least one of the three phases to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

22. The phase selection unit according to claim 21, wherein the means for obtaining and the means for determining comprise processing circuitry capable of executing software instruction stored in a non-transitory computer readable medium, the processing circuit comprising a central processing unit (CPU), a multiprocessor, a microcontroller, or a digital signal processor (DSP).

23. The phase selection unit according to claim 21, wherein the means for obtaining and the means for determining comprise an application specific integrated circuit (ASIC) or a field programmable gate array (FPGA).

24. A computer program product for use in phase selection using multi-terminal measurements of a transmission line of a power system, the computer program product comprising a non-transitory computer readable storage medium on which computer code is stored, the computer code, when run on processing circuitry of a phase selection unit, causes the phase selection unit to:
  obtain, using measurements from a plurality of terminals of the transmission line, delta differential current values $\Delta I_{diffA}(t)$, $\Delta I_{diffB}(t)$, $\Delta I_{diffC}(t)$ at time t between pre-fault differential current measurements and post-fault differential current measurements from three phases A, B, C of the transmission line; and
  determine at least one of the three phases to be faulty when the absolute value of the corresponding delta differential current value is larger than k times the minimum of all the absolute values $|\Delta I_{diffA}(t)|$, $|\Delta I_{diffB}(t)|$, $|\Delta I_{diffC}(t)|$ of the delta differential current values, where k>1 is a scale factor.

* * * * *

UNITED STATES PATENT AND TRADEMARK OFFICE
CERTIFICATE OF CORRECTION

| | | |
|---|---|---|
| PATENT NO. | : 11,280,824 B2 | Page 1 of 1 |
| APPLICATION NO. | : 16/956130 | |
| DATED | : March 22, 2022 | |
| INVENTOR(S) | : YouYi Li et al. | |

It is certified that error appears in the above-identified patent and that said Letters Patent is hereby corrected as shown below:

In the Claims

Claim 1, Column 9, Line 37; delete "I$\Delta I_{diffA}$(t)|, I$\Delta I_{diffB}$(t)|, I$\Delta I_{diffC}$(t)|" and insert --|$\Delta I_{diffA}(t)$|, |$\Delta I_{diffB}(t)$|, |$\Delta I_{diffC}(t)$|--.

Claim 9, Column 9, Line 63; delete "0.05" and insert --0.5--.

Claim 13, Column 10, Lines 20-21; delete "|$\Delta I_{diffA}$(t) |, I$\Delta I_{diffB}$(t)|, I$\Delta I_{diffC}$(t)|" and insert --|$\Delta I_{diffA}(t)$|, |$\Delta I_{diffB}(t)$|, |$\Delta I_{diffC}(t)$|--.

Claim 21, Column 10, Line 54-55; delete "I$\Delta I_{diffA}$(t) |, I$\Delta I_{diffB}$(t)|, I$\Delta I_{diffC}$ (t)|" and insert --|$\Delta I_{diffA}(t)$|, |$\Delta I_{diffB}(t)$|, |$\Delta I_{diffC}(t)$|--.

Claim 24, Column 11, Lines 17-18; delete "I$\Delta I_{diffA}$(t)|, I$\Delta I_{diffB}$(t)|, I$\Delta I_{diffC}$(t)|" and insert --|$\Delta I_{diffA}(t)$|, |$\Delta I_{diffB}(t)$|, |$\Delta I_{diffC}(t)$|--.

Signed and Sealed this
Twenty-sixth Day of April, 2022

*Katherine Kelly Vidal*

Katherine Kelly Vidal
*Director of the United States Patent and Trademark Office*